United States Patent
Shibasaki

(10) Patent No.: US 9,722,616 B2
(45) Date of Patent: Aug. 1, 2017

(54) RECEPTION CIRCUIT

(71) Applicant: FUJITSU LIMITED, Kawasaki-shi, Kanagawa (JP)

(72) Inventor: Takayuki Shibasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/185,964

(22) Filed: Jun. 17, 2016

(65) Prior Publication Data

US 2017/0026047 A1    Jan. 26, 2017

(30) Foreign Application Priority Data

Jul. 22, 2015    (JP) .................................. 2015-144789

(51) Int. Cl.
| | |
|---|---|
| H03D 3/24 | (2006.01) |
| H03L 7/087 | (2006.01) |
| H03L 7/107 | (2006.01) |
| H03L 7/08 | (2006.01) |
| H04L 7/06 | (2006.01) |

(52) U.S. Cl.
CPC ............ *H03L 7/087* (2013.01); *H03L 7/0807* (2013.01); *H03L 7/1072* (2013.01); *H04L 7/06* (2013.01)

(58) Field of Classification Search
CPC ..... H03L 7/087; H03L 7/1072; H03L 7/0807; H03L 7/0995; H03L 7/0891; H03L 7/085; H04L 7/06; H04L 7/033; H04L 7/0079; H04L 25/02; H04L 27/0014
USPC ................................................. 375/375, 376
See application file for complete search history.

(56) References Cited

U.S. PATENT DOCUMENTS

| | | | |
|---|---|---|---|
| 5,012,494 A * | 4/1991 | Lai ........................ | H03K 3/0315 331/17 |
| 5,473,639 A * | 12/1995 | Lee ........................ | H03L 7/0995 331/16 |
| 6,055,286 A | 4/2000 | Wu et al. | |
| 7,590,207 B1 * | 9/2009 | Shumarayev ............ | H03L 7/087 331/11 |
| 8,477,895 B1 * | 7/2013 | Wang .................. | H04L 27/0014 375/354 |
| 9,059,837 B1 * | 6/2015 | Tsunoda .................. | H04L 7/033 |
| 9,191,187 B2 * | 11/2015 | Shibasaki ............. | H04L 7/0079 |

(Continued)

FOREIGN PATENT DOCUMENTS

| | | |
|---|---|---|
| JP | 2001-177397 | 6/2001 |
| JP | 2005-252723 | 9/2005 |

*Primary Examiner* — Phuong Phu
(74) *Attorney, Agent, or Firm* — Fujitsu Patent Center

(57) ABSTRACT

A determination circuit receives an input data signal and determines a value of the input data signal when a logic level of a sampling clock changes. A sampling clock generation circuit generates the sampling clock on the basis of the input data signal, generates a frequency adjustment value on the basis of the frequency difference between the sampling clock and the input data signal, and adjusts the frequency of the sampling clock on the basis of the frequency adjustment value. A frequency pull-in control circuit performs integration on frequency adjustment values and obtains an integral value in an individual time period. When the integral value reaches a threshold before a single time period elapses, the frequency pull-in control circuit outputs a reset signal that causes the sampling clock generation circuit to output an initial value of the frequency adjustment value until the time period elapses.

8 Claims, 14 Drawing Sheets

(56) References Cited

U.S. PATENT DOCUMENTS

| | | | |
|---|---|---|---|
| 9,264,026 B2* | 2/2016 | Shibasaki | H03K 5/135 |
| 9,287,883 B2* | 3/2016 | Shibasaki | H03L 7/0807 |
| 9,344,269 B2* | 5/2016 | Shibasaki | H03L 7/0891 |
| 9,520,883 B2* | 12/2016 | Shibasaki | H03L 7/085 |
| 2003/0202804 A1 | 10/2003 | Hasegawa et al. | |
| 2007/0177703 A1 | 8/2007 | Senba | |
| 2013/0216003 A1* | 8/2013 | Zhuang | H04L 25/02 375/316 |
| 2014/0097878 A1* | 4/2014 | Sindalovsky | H03L 7/087 327/156 |

* cited by examiner

RECEPTION CIRCUIT

CROSS-REFERENCE TO RELATED APPLICATION

This application is based upon and claims the benefit of priority of the prior Japanese Patent Application No. 2015-144789, filed on Jul. 22, 2015, the entire contents of which are incorporated herein by reference.

FIELD

The embodiments discussed herein relate to a reception circuit.

BACKGROUND

In recent years, information processing apparatuses have significantly been improved in their performance. With this improvement, the data rates of data signals exchanged inside and outside the information processing apparatuses have also been increased.

When a reception circuit receives an input data signal, the reception circuit performs clock and data recovery (CDR) for recovering a value of the input data signal and a clock.

In one CDR method, an input data signal is sampled by using a clock (sampling clock) recovered from the input data signal, not by using a reference clock. In this method, the phase difference and the frequency difference between the sampling clock and the input data signal are detected to adjust the sampling clock. A 2× sampling method is used for detecting the phase of the sampling clock. In this method, sampling is performed twice per unit interval (UI). In addition, a 4× sampling method is used for detecting the frequency of the sampling clock. In this method, sampling is performed four times per UI.

In the above frequency detection method, a phase region from 0° to 360° is divided into four quadrants, and the quadrant in which an edge of an input data signal detected by using the sampling clock exists is detected. Next, a phase rotation direction is detected on the basis of the shift of the phases of edges over quadrants. On the basis of the phase rotation direction, whether the frequency of the sampling clock is lower or higher than that of the input data signal is detected, and a frequency adjustment value based on the detection result is outputted. See, for example, the following documents:

Japanese Laid-open Patent Publication No. 2005-252723;
Japanese Laid-open Patent Publication No. 2001-177397; and
U.S. Pat. No. 6,055,286.

However, with the above frequency detection method, when the frequency difference between the input data signal and the sampling clock is small, since the phase shift amount between edges of the input data signal is small, it takes time for the phases of the edges to shift over quadrants. Namely, the frequency detection takes time.

One solution to address this problem is outputting the same adjustment value until the next frequency difference is detected so that a larger shift amount is obtained per frequency difference detection. Namely, the gain used in frequency adjustment is equivalently increased. However, if a large shift amount is obtained per frequency difference detection, when the frequency difference between the input data signal and the sampling clock is small, an excessive adjustment could be made. As a result, the convergence could be deteriorated.

As described above, if a reception circuit using the conventional frequency detection method is used, it takes time for the frequency of the sampling clock to converge into a target frequency.

SUMMARY

According to one aspect, there is provided a reception circuit including: a determination circuit configured to receive an input data signal and determine a value of the input data signal when a logic level of a sampling clock changes; a sampling clock generation circuit configured to generate the sampling clock based on the input data signal, generate a frequency adjustment value based on a frequency difference between the sampling clock and the input data signal, and adjust a frequency of the sampling clock based on the frequency adjustment value; and a frequency pull-in control circuit configured to perform integration on the frequency adjustment value obtained in plurality and obtain a first integral value in an individual first time period, wherein, when the first integral value reaches a first value before a single first time period elapses, the frequency pull-in control circuit outputs a reset signal that causes the sampling clock generation circuit to output an initial value of the frequency adjustment value until the first time period elapses.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
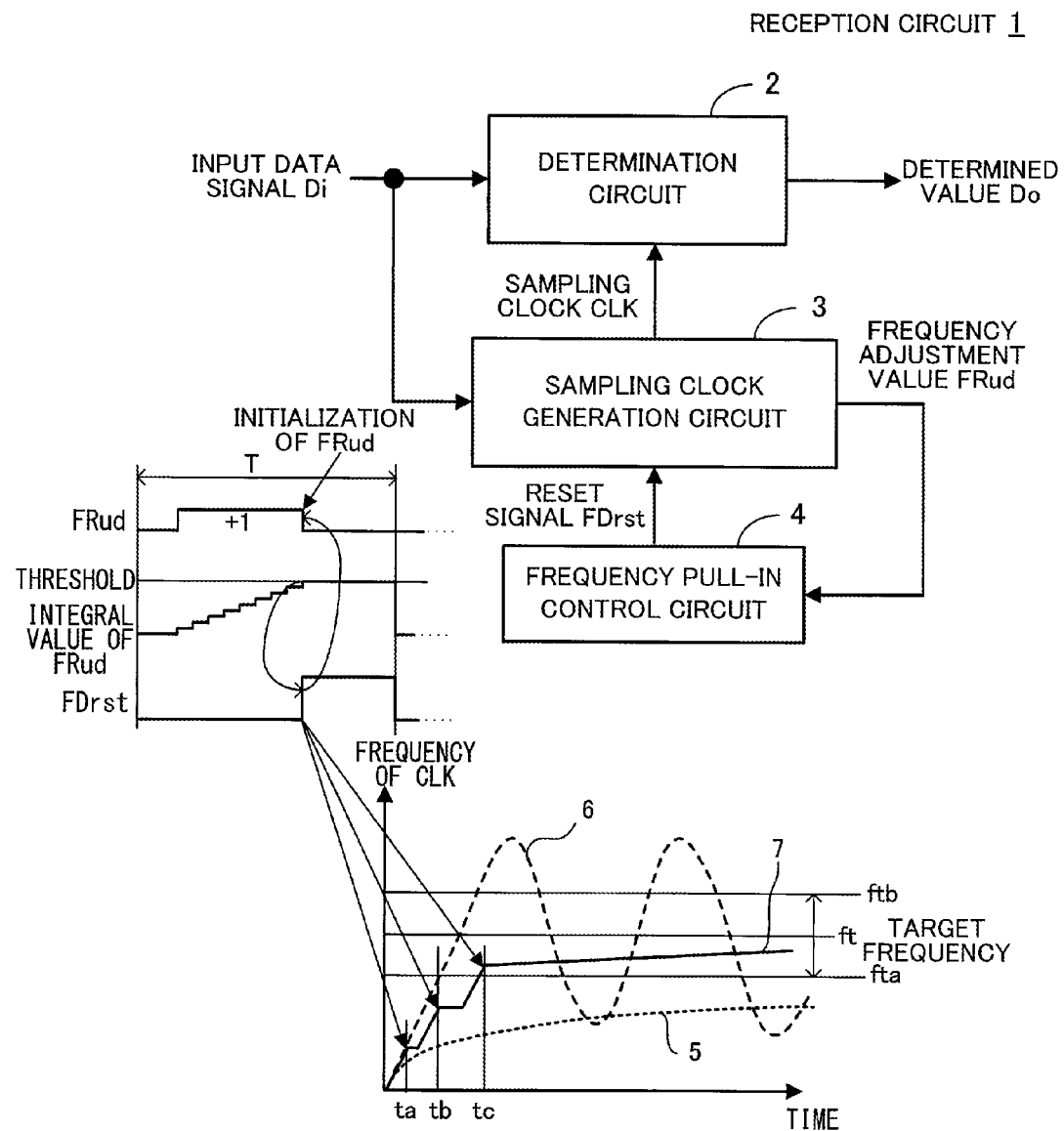
FIG. 1 illustrates an example of a reception circuit according to a first embodiment.

Hereinafter, several embodiments will be described with reference to the accompanying drawings, wherein like reference characters refer to like elements throughout.

First Embodiment

FIG. 1 illustrates an example of a reception circuit 1 according to a first embodiment.

The reception circuit 1 includes a determination circuit 2, a sampling clock generation circuit 3, and a frequency pull-in control circuit 4.

The determination circuit 2 receives an input data signal Di, determines a value of this input data signal Di when the logic level of a sampling clock CLK changes, and outputs a determined value Do. For example, at the rising edge of the sampling clock CLK (when the logic level of the sampling clock CLK changes from a low (L) level to a high (H) level), the determination circuit compares the input data signal Di with a data determination threshold. If the input data signal Di is larger than the threshold, the determination circuit 2 outputs 1 as the determined value Do. If the input data signal Di is smaller than the threshold, the determination circuit 2 outputs 0 as the determined value Do.

On the basis of the input data signal Di, the sampling clock generation circuit 3 generates the sampling clock CLK and generates a frequency adjustment value FRud based on the frequency difference between the sampling clock CLK and the input data signal Di. On the basis of the frequency adjustment value FRud, the sampling clock generation circuit 3 adjusts the frequency of the sampling clock CLK.

For example, the sampling clock generation circuit 3 generates the frequency adjustment value FRud based on the frequency difference between the sampling clock CLK and the input data signal Di by using the above 4× sampling method. When the frequency of the sampling clock CLK is lower than that of the input data signal Di, the sampling clock generation circuit 3 generates "+1" as the frequency adjustment value FRud, to increase the frequency of the sampling clock CLK. When the frequency of the sampling clock CLK is higher than that of the input data signal Di, the sampling clock generation circuit 3 generates "−1" as the frequency adjustment value FRud, to decrease the frequency of the sampling clock CLK. The initial value of the frequency adjustment value FRud is 0, for example. The sampling clock generation circuit 3 may output the frequency adjustment value FRud as a 2-bit value.

In addition, the sampling clock generation circuit 3 generates a phase adjustment value based on the phase difference between the sampling clock CLK and the input data signal Di and adjusts the phase of the sampling clock CLK on the basis of the phase adjustment value. In addition, the sampling clock generation circuit 3 determines whether the frequency of the sampling clock CLK has been converged, namely, whether the frequency of the input data signal Di is synchronized with that of the sampling clock CLK. If the sampling clock generation circuit 3 determines that the frequency of the sampling clock CLK has been converged, the sampling clock generation circuit 3 outputs a signal indicating the convergence.

The frequency pull-in control circuit 4 continuously performs integration on frequency adjustment values FRud and obtains an integral value thereof in an individual certain time period. If the integral value in a single certain time period reaches a certain value (threshold) before the time period elapses, the frequency pull-in control circuit 4 outputs a reset signal FDrst that causes the sampling clock generation circuit 3 to output an initial value of the frequency adjustment value until the time period elapses.

For example, as illustrated in FIG. 1, when the integral value of frequency adjustment values FRud reaches a threshold in a time period T, the frequency pull-in control circuit 4 raises the logic level of the reset signal FDrst from the L level to the H level and maintains the H level until the time period T elapses. When the time period T elapses, the integral value of the frequency adjustment values FRud is reset. An example of how to set the time period T and the threshold will be described below.

Next, an example of a control operation of pulling in the frequency of the sampling clock CLK (an operation of converging the frequency) performed by the reception circuit 1 according to the first embodiment will be described.

A target frequency ft illustrated in FIG. 1 is the frequency of the clock superimposed on the input data signal Di, for example. Frequencies fta and ftb are set so that the target frequency ft is in the middle therebetween. The range between the frequencies fta and ftb is the range within which the sampling clock generation circuit 3 is able to converge the frequency of the sampling clock CLK into the target frequency ft by using its phase adjustment functions.

For comparison, in FIG. 1, waveforms 5 and 6 illustrate frequency changes of the sampling clock CLK generated in a reception circuit that does not include the above frequency pull-in control circuit 4.

The waveform 5 indicates change of the frequency of the sampling clock CLK over time when the gain for adjusting the frequency of the sampling clock CLK is relatively small and when the amount of adjustment to be made to the frequency when the frequency difference from the input data signal Di is detected is small. As illustrated by the waveform 5, it takes time for the frequency to converge into the range between the frequencies fta and ftb. There is a possibility that the frequency of the sampling clock CLK will not be synchronized at all because of noise or the phase adjustment function simultaneously operated with the frequency adjustment function.

To address this problem, as indicated by the waveform 6, the gain for adjusting the frequency of the sampling clock CLK may be increased to be larger than that of the waveform 5, and the amount of adjustment to be made to the frequency when the frequency difference from the input data signal Di is detected may be increased. For example, the same frequency adjustment value FRud may be outputted until the next frequency difference is detected so that a larger shift amount is obtained per frequency difference detection. In this way, the gain used in frequency adjustment is equivalently increased. However, if a large shift amount is obtained per frequency difference detection, when the frequency difference between the input data signal Di and the sampling clock CLK is small, an excessive adjustment could be made. As a result, the convergence of the frequency could be deteriorated. This is because the frequency detection rate is decreased when the frequency difference is small. More specifically, after the frequency of the sampling clock CLK exceeds the target frequency, if no frequency detection is performed, a frequency adjustment value FRud indicating "+1" is continuously outputted. Consequently, the frequency continues to be increased.

In addition, it is difficult to optimize the gain for adjusting the frequency of the sampling clock CLK. This is because the gain for adjusting the frequency of the sampling clock CLK changes depending on various parameters such as the noise of the input data signal Di or the gain or the characteristics in the sampling clock generation circuit 3.

With the reception circuit 1 according to the first embodiment, as indicated by a waveform 7 in FIG. 1 for example, since the integral value of frequency adjustment values FRud reaches the threshold at time ta, tb, and tc, the frequency pull-in control circuit 4 raises the logical level of the reset signal FDrst from the L level to the H level. Consequently, the frequency adjustment value FRud is initialized (reset) to 0, and the frequency adjustment is stopped. When the time period T elapses, the frequency pull-in control circuit 4 resets both the reset signal FDrst and the integral value to 0. Thereafter, the next frequency adjustment based on the frequency adjustment values FRud is performed.

With the reception circuit 1, when the integral value of frequency adjustment values FRud based on the frequency difference between the input data signal Di and the sampling clock CLK reaches the threshold, the frequency adjustment value FRud is initialized. Thus, even when the frequency difference is small, an excessive adjustment is prevented, which could occur with conventional reception circuits. In the above-described way, the frequency of the sampling clock CLK is more easily pulled into the range between the frequencies fta and ftb. Namely, the time needed for converging the frequency of the sampling clock CLK is shortened.

In addition, as described above, when the frequency difference between the input data signal Di and the sampling clock CLK is small, it takes time to detect the frequency. Therefore, for example, the case in which the frequency adjustment value FRud is set to "+1" immediately after the reset signal FDrst is lowered from the H level to the L level and the frequency of the sampling clock CLK exceeds the target frequency ft after the time tc is prevented. Namely, the sampling clock generation circuit 3 detects synchronization of the frequencies more quickly.

In addition, when the frequency difference between the input data signal Di and the sampling clock CLK is large, the frequency detection rate is increased. For example, after the reset signal FDrst is lowered from the H level to the L level after the time ta, the frequency adjustment value FRud is set to "+1" relatively soon. Namely, the time needed for converging the frequency of the sampling clock CLK is reduced.

Second Embodiment

Figure 2:
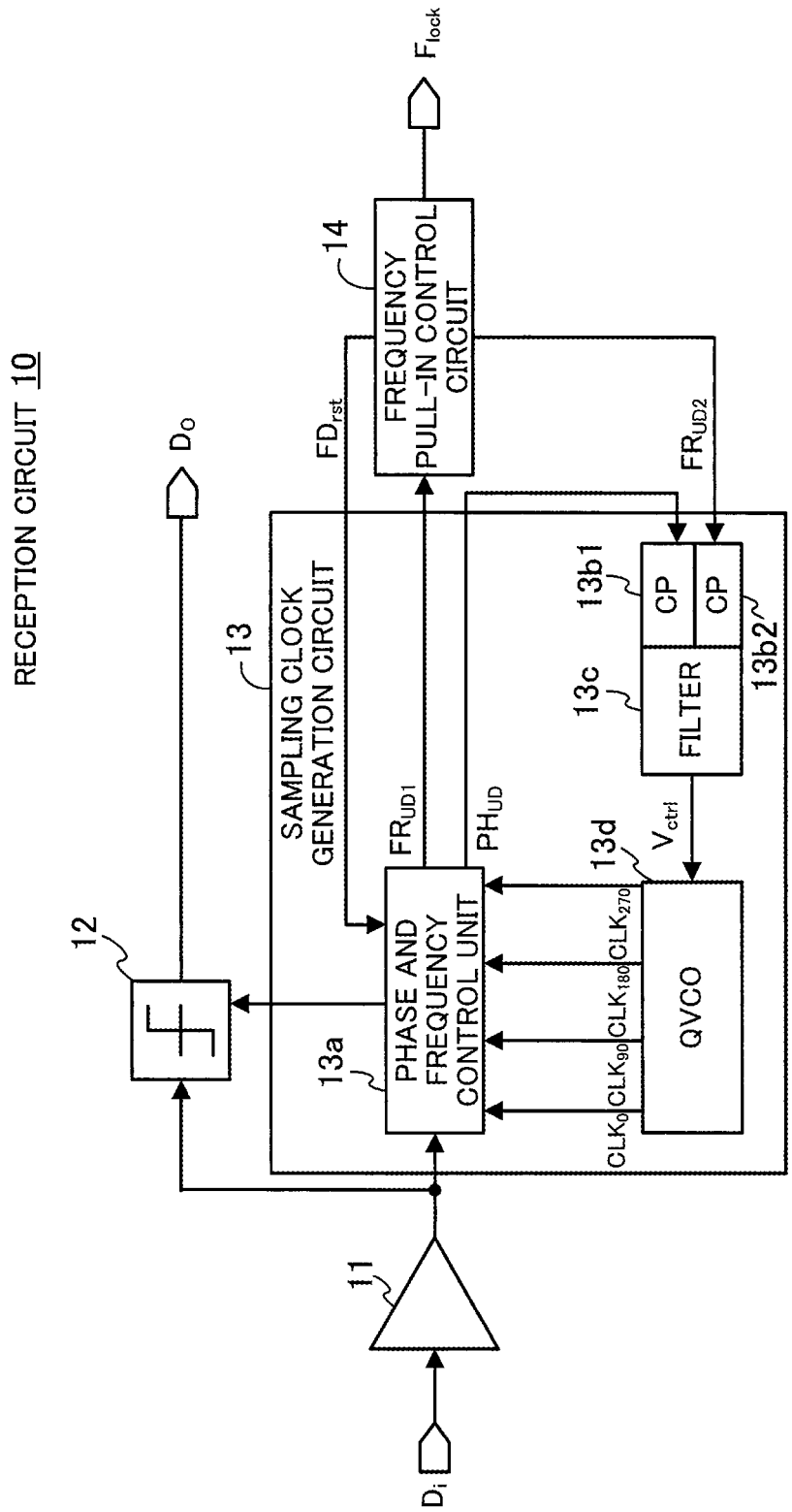
FIG. 2 illustrates an example of a reception circuit according to a second embodiment.

FIG. 2 illustrates an example of a reception circuit 10 according to a second embodiment.

The reception circuit 10 according to the second embodiment uses the 4× sampling method to detect the frequency of the sampling clock. In the 4× sampling method, sampling is performed four times per UI. The reception circuit 10 includes a buffer 11, a comparison circuit 12, a sampling clock generation circuit 13, and a frequency pull-in control circuit 14.

The buffer 11 performs equalization processing on an input data signal $D_i$.

The comparison circuit 12 includes functions equivalent to those of the determination circuit 2 illustrated in FIG. 1. The comparison circuit 12 compares a data signal outputted from the buffer 11 with a threshold at a rising (or falling) edge of a sampling clock generated (recovered) by the sampling clock generation circuit 13. The threshold corresponds to the median of the amplitude of the data signal. In addition, the comparison circuit 12 outputs the comparison result as a determined value $D_o$.

For example, if a voltage represented by the data signal is larger than the threshold that corresponds to the median of the amplitude of the data signal, the comparison circuit 12 outputs 1 as the determined value $D_o$. If the voltage is smaller than the threshold, the comparison circuit 12 outputs 0 as the determined value $D_o$.

The sampling clock generation circuit 13 includes functions equivalent to those of the sampling clock generation circuit 3 illustrated in FIG. 1. The sampling clock generation circuit 13 includes a phase and frequency control unit 13a, change pumps (CP) 13b1 and 13b2, a filter 13c, and a quadrature voltage controlled oscillator (QVCO) 13d.

The phase and frequency control unit 13a detects the phase difference and the frequency difference between the sampling clock and the data signal that is outputted from the buffer 11 by using clocks of four phases $CLK_0$, $CLK_{90}$, $CLK_{180}$, and $CLK_{270}$ that are outputted from the QVCO 13d. In addition, on the basis of the detected phase difference, the phase and frequency control unit 13a outputs a phase adjustment value $PH_{UD}$ for adjusting the phase of the sampling clock and outputs a frequency adjustment value $FR_{UD1}$ for adjusting the frequency of the sampling clock.

On the basis of the phase adjustment value $PH_{UD}$ output from the phase and frequency control unit 13a and a frequency adjustment value $FR_{UD2}$ outputted from the frequency pull-in control circuit 14, the CPs 13b1 and 13b2 adjust current values that they output. The CP 13b1 adjusts its current value on the basis of the phase adjustment value $PH_{UD}$, and the CP 13b2 adjusts its current value on the basis of the frequency adjustment value $FR_{UD2}$. The outputs from the CPs 13b1 and 13b2 are short-circuited. In addition, the gain of the CP 13b2 is larger than that of the CP 13b1. Therefore, even when the phase adjustment value $PH_{UD}$ and the frequency adjustment value $FR_{UD2}$ are both "+1", change of the current value outputted from the CP 13b2 is larger than that of the current value outputted from the CP 13b1. For example, the gain of the CP 13b2 is set approximately ten times larger than that of the CP 13b1.

The filter 13c converts the current value outputted from the CPs 13b1 and 13b2 into a voltage value and outputs the voltage value as a controlled voltage value $V_{ctrl}$.

On the basis of the controlled voltage value $V_{ctrl}$, the QVCO 13d outputs the clocks $CLK_0$ to $CLK_{270}$ having different oscillation frequencies. The phases of two neighboring clocks among the clocks $CLK_0$ to $CLK_{270}$ differ from each other by 90°.

The frequency pull-in control circuit 14 includes functions equivalent to those of the frequency pull-in control circuit 4 illustrated in FIG. 1. The frequency pull-in control circuit 14 performs integration on frequency adjustment values $FR_{UD1}$ and obtains an integral value thereof in an individual first time period (which will hereinafter be referred to as a time period T1). If the integral value in a single time period T1 reaches a certain value (threshold) before the single time period T1 elapses, the frequency pull-in control circuit 14 outputs a reset signal $FD_{rst}$ that causes the phase and frequency control unit 13a to output an initial value of the frequency adjustment value $FR_{UD1}$ until the time period T1 elapses. In addition, on the basis of the integral value of frequency adjustment values $FR_{UD1}$ in an individual second time period (which will hereinafter be referred to as a time period T2), the frequency pull-in control circuit 14 determines whether the frequency of the sampling clock has been converged (whether the frequency has been synchronized). Until the frequency pull-in control circuit 14 determines synchronization of the frequencies, the frequency pull-in control circuit 14 outputs the frequency adjustment value $FR_{UD1}$ as the frequency adjustment value $FR_{UD2}$ to the CP 13b2. When the frequency pull-in control circuit 14 determines synchronization of the frequencies, the frequency pull-in control circuit 14 sets the frequency adjustment value $FR_{UD2}$ to "0." In addition, when the frequency pull-in control circuit 14 determines synchronization of the frequencies, the frequency pull-in control circuit 14 outputs an H-level lock signal $F_{lock}$.

Figure 3:
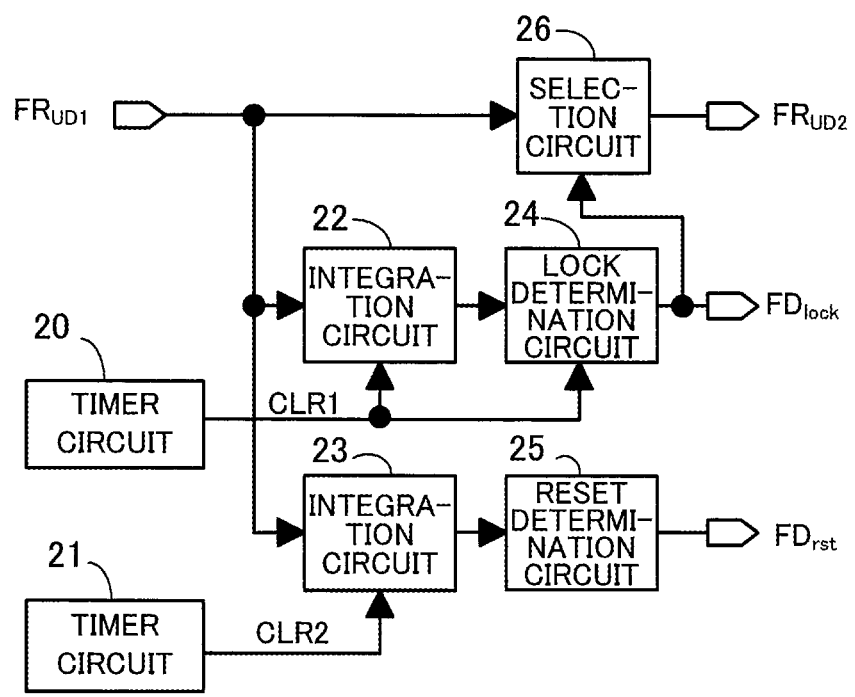
FIG. 3 illustrates an example of a frequency pull-in control circuit.

FIG. 3 illustrates an example of the frequency pull-in control circuit 14.

The frequency pull-in control circuit 14 includes timer circuits 20 and 21, integration circuits 22 and 23, a lock determination circuit 24, a reset determination circuit 25, and a selection circuit 26.

The timer circuit 20 outputs a clear signal CLR whose logic level is raised to the H level for a predetermined time period after the individual time period T2. The timer circuit 21 outputs a clear signal CLR 2 whose logic level is raised to the H level for a predetermined time period after the individual time period T1.

The integration circuit 22 performs integration on frequency adjustment values $FR_{UD1}$, obtains an integral value thereof, and outputs the obtained integral value to the lock determination circuit 24. If the logic level of the clear signal CLR 1 is raised to the H level, the integration circuit 22 resets the integral value to 0.

The integration circuit 23 performs integration on frequency adjustment values $FR_{UD1}$, obtains an integral value thereof, and outputs the obtained integral value to the reset determination circuit 25. If the logic level of the clear signal CLR 2 is raised to the H level, the integration circuit 23 resets the integral value to 0.

Each of the integration circuits 22 and 23 may be realized by an adder and a resistor (not illustrated), for example. The adder adds up a frequency adjustment value $FR_{UD1}$ and a value stored in the resistor in the corresponding predetermined time period and outputs the result of the addition as an integral value. On the basis of the addition result, each of the integration circuits 22 and 23 updates the value of the corresponding resistor.

When the logic level of the clear signal CLR 1 is raised to the H level, the lock determination circuit determines whether the integral value outputted from the integration circuit 22 falls within a range defined by two thresholds. If the lock determination circuit 24 determines that the integral value falls within the range, the lock determination circuit 24 outputs an H-level lock signal $FD_{lock}$ that indicates synchronization of the frequencies of the sampling clock and the data signal. Otherwise, the lock determination circuit 24 maintains the logic level of the lock signal $FD_{lock}$ at the L level.

The reset determination circuit 25 determines whether the integral value outputted from the integration circuit 23 has reached the threshold. If the reset determination circuit 25 determines that the integral value outputted from the integration circuit 23 has reached the threshold, the reset determination circuit 25 raises the logic level of the reset signal $FD_{rst}$ to the H level. Otherwise, the reset determination circuit 25 maintains the logic level of the reset signal $FD_{rst}$ at the L level.

On the basis of the value (the logic level) of the lock signal $FD_{lock}$, the selection circuit 26 selects whether to output the frequency adjustment value $FR_{UD1}$ as the frequency adjustment value $FR_{UD2}$ or output the frequency adjustment value $FR_{UD2}$ as 0. While the logic level of the lock signal $FD_{lock}$ is at the L level, the selection circuit 26 outputs the frequency adjustment value $FR_{UD1}$ as the frequency adjustment value $FR_{UD2}$. If the logic level of the lock signal $FD_{lock}$ is the H level, the selection circuit 26 outputs the frequency adjustment value $FR_{UD2}$ as 0.

Next, an example of an operation performed by the reception circuit 10 will be described.

Figure 4:
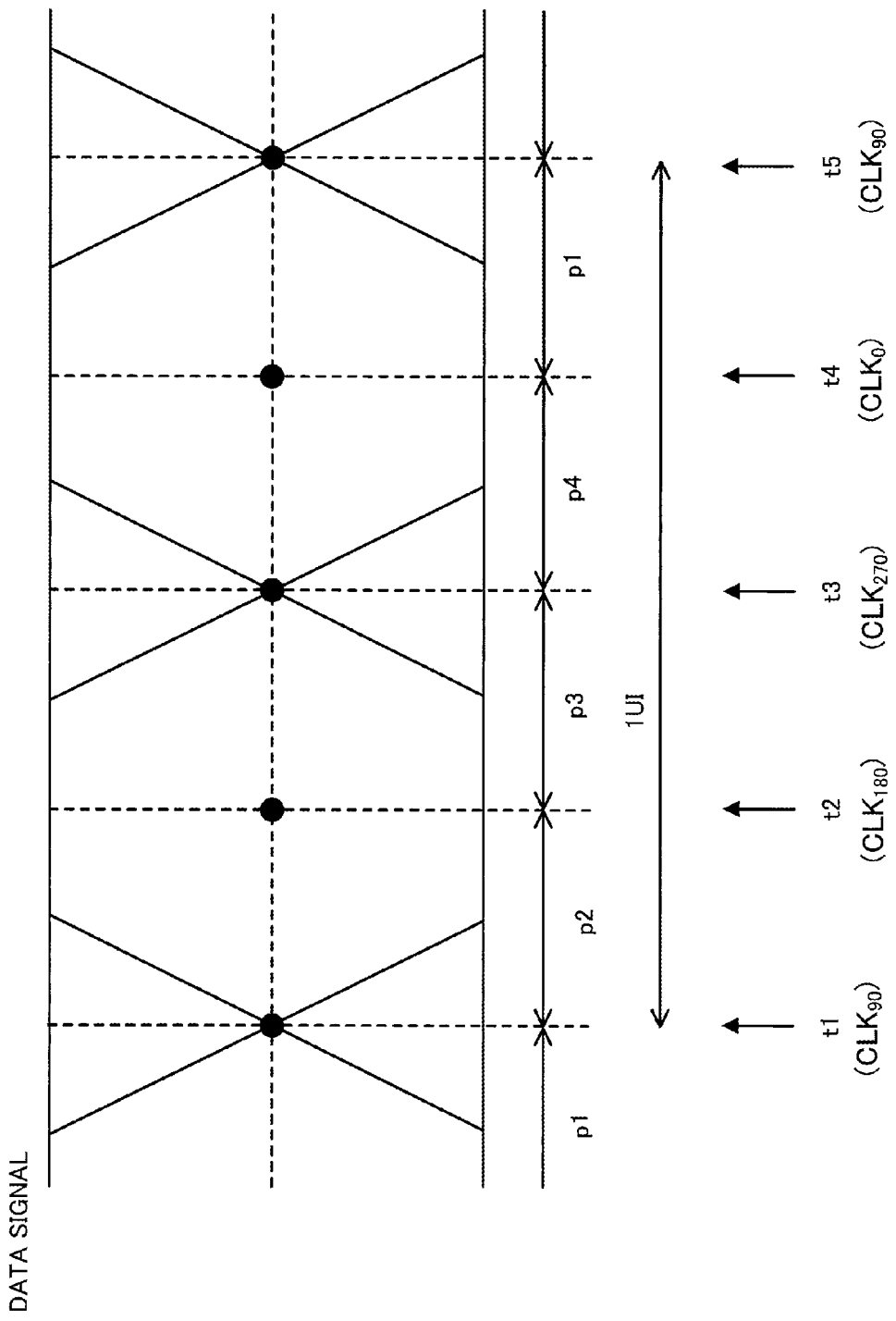
FIG. 4 illustrates an example of sampling timing at which a data signal is sampled by using clocks of four phases.

FIG. 4 illustrates an example of sampling timing at which a data signal is sampled by using clocks of four phases.

FIG. 4 illustrates a data signal and rising edges (timing when an individual logic level is raised from the L level to H level) of the clocks $CLK_0$ to $CLK_{270}$ outputted from the QVCO 13d. For example, timing t1 and timing t5 represent rising edges of the clock $CLK_{90}$. Timing t2 represents a rising edge of the clock $CLK_{280}$. Timing t3 represents a rising edge of the clock $CLK_{270}$. Timing t4 represents a rising edge of the clock $CLK_0$. In FIG. 4, data signals of various data patterns are superimposed.

When the frequency is detected by using the 4× sampling method, sampling is performed four times per UI. In this method, for example, a phase region from 0° to 360° is divided by the above timing t1 to t5 into four quadrants. Hereinafter, assuming that the phase of a rising edge of the clock $CLK_0$ at timing t4 is 0°, the phase region from 0° to 90° defined between the timing t4 and t5 will be referred to as a quadrant p1, the phase region from 90° to 180° defined between the timing t1 and t2 will be referred to as a quadrant p2, the phase region from 180° to 270° defined between the timing t2 and t3 will be referred to as a quadrant p3, and the phase region from 270° to 360° (0°) defined between the timing t3 and t4 will be referred to as a quadrant p4.

The reception circuit 10 according to the second embodiment samples a data signal at the above timing t1 to t5, to detect where the phase of an edge of the data signal exists in the quadrants p1 to p4. More specifically, at each of the timing t1 to t5, a determination circuit (not illustrated) in the phase and frequency control unit 13a compares the data signal with the threshold (which corresponds to the median of the amplitude of the data signal). On the basis of the comparison result, the phase and frequency control unit 13a determines where the phase of the edge of the data signal exists in the quadrants p1 to p4.

For example, if the threshold is larger than the data signal at the timing t2 and if the threshold is smaller than the data signal at the timing t3, the phase and frequency control unit 13a determines that the edge (the rising edge) of the data signal exists in the quadrant p3.

Figure 5:
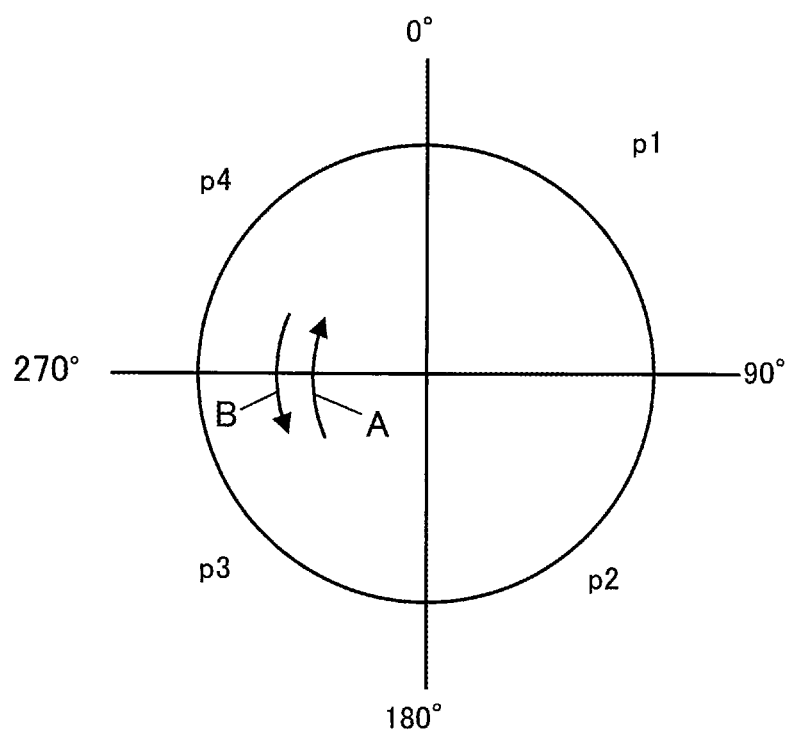
FIG. 5 illustrates examples of phase rotation.

FIG. 5 illustrates examples of phase rotation.

For example, by performing the above processing, the phase and frequency control unit 13a detects that the edge of the data signal exists in the quadrant p3 and subsequently detects that the edge of the data signal exists in the quadrant p4. In this case, the phase and frequency control unit 13a determines that the phase of the edge of the data signal rotates from the quadrant p3 to p4 in the direction indicated by arrow A in FIG. 5. This indicates that the period of the sampling clock (for example, the clock $CLK_0$) is longer than 1 UI. Namely, the frequency of the sampling clock is lower than that of the data signal. Therefore, the phase and frequency control unit 13a outputs the frequency adjustment value $FR_{UD1}$ indicating "+1" for increasing the frequency of the sampling clock.

In another example, the phase and frequency control unit 13a detects that the edge of the data signal exists in the quadrant p4 and subsequently detects that the edge of the data signal exists in the quadrant p3. In this case, the phase and frequency control unit 13a determines that the phase of the edge of the data signal rotates from the quadrant p4 to p3 in the direction indicated by arrow B in FIG. 5. This indicates that the period of the sampling clock (for example, the clock $CLK_0$) is shorter than 1 UI. Namely, the frequency of the sampling clock is higher than that of the data signal. Therefore, the phase and frequency control unit 13a outputs a frequency adjustment value $FR_{UD1}$ indicating "−1" for decreasing the frequency of the sampling clock.

Simultaneously with the frequency detection, the phase and frequency control unit 13a generates the phase adjustment value $PH_{UD}$ on the basis of the phase difference between the sampling clock and the data signal.

When the frequency pull-in control circuit 14 receives the above frequency adjustment value $FR_{UD1}$, the frequency pull-in control circuit 14 performs the following processing.

Figure 6:
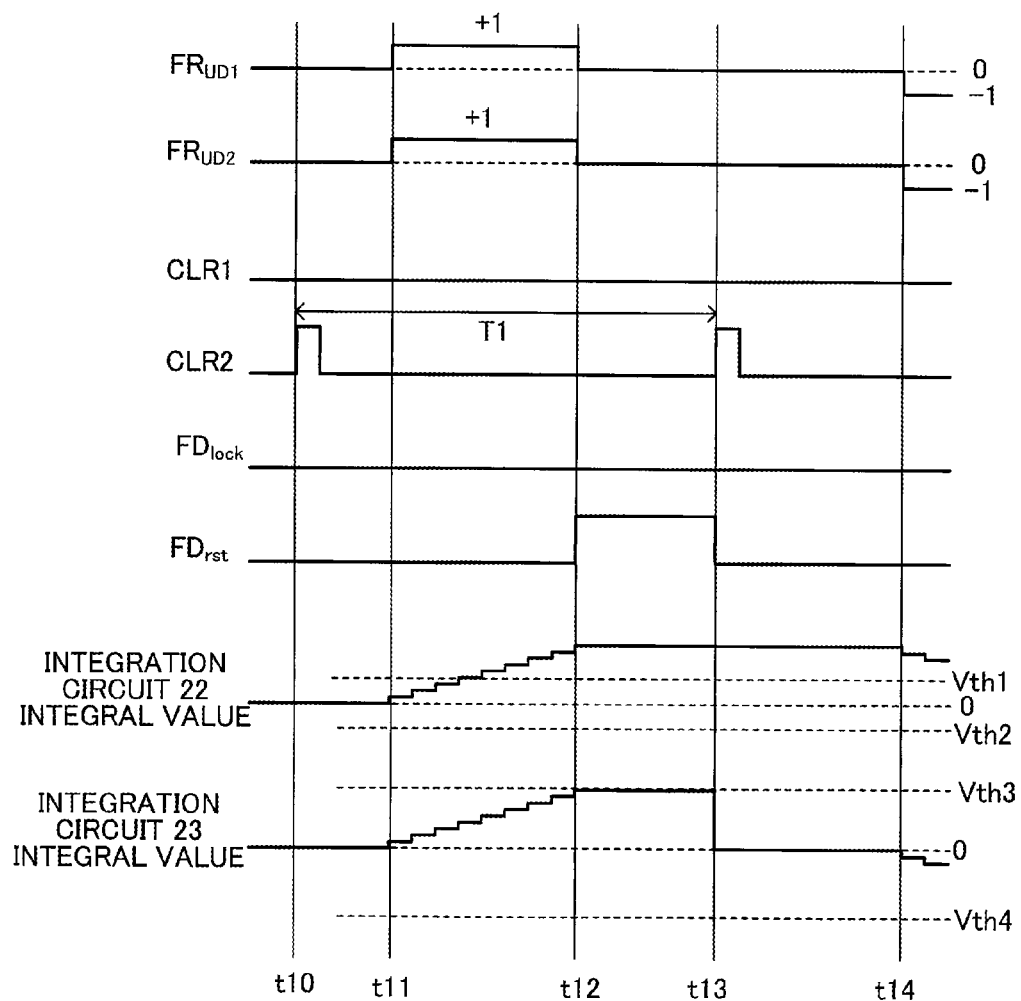
FIG. 6 illustrates an example of an operation of resetting a frequency adjustment value performed by the frequency pull-in control circuit.

FIG. 6 illustrates an example of an operation of resetting the frequency adjustment value performed by the frequency pull-in control circuit 14.

FIG. 6 illustrates waveforms of the frequency adjustment values $FR_{UD1}$ and $FR_{UD2}$, the clear signals CLR 1 and CLR 2, the lock signal $FD_{lock}$, the reset signal $FD_{rst}$, and the integral values outputted from the integration circuits 22 and 23.

The logic level of the clear signal CLR 2 outputted from the timer circuit 21 is maintained at the H level for a predetermined time period after the timing t10. Subsequently, as a result of the above frequency detection, the phase and frequency control unit 13a determines that the frequency of the sampling clock is lower than that of the data signal and outputs the frequency adjustment value $FR_{UD1}$ indicating "+1" (timing t11). This causes the integration circuits 22 and 23 to start performing integration on frequency adjustment values $FR_{UD1}$. The integration circuits 22 and 23 update their integral values obtained from the frequency adjustment values $FR_{UD1}$ per predetermined time period.

Since the logic level of the clear signal CLR 1 remains at the L level, the lock determination circuit 24 does not perform the determination of whether the integral value outputted from the integration circuit 22 falls within a range defined by thresholds Vth 1 and Vth 2. Consequently, since the logic level of the lock signal $FD_{lock}$ remains at the L level, the selection circuit 26 outputs the frequency adjustment value $FR_{UD1}$ as the frequency adjustment value $FR_{UD2}$. Thus, the sampling clock generation circuit 13 continues to increase the frequency of the sampling clock.

The reset determination circuit 25 determines whether the integral value outputted from the integration circuit 23 has reached a threshold Vth 3 or Vth 4. In the example in FIG. 6, at timing t12, the reset determination circuit 25 determines that the integral value outputted from the integration circuit 23 has reached the threshold Vth 3. Consequently, the reset determination circuit 25 raises the logic level of the reset signal $FD_{rst}$ to the H level. Thus, the frequency adjustment value $FR_{UD1}$ outputted from the phase and frequency control unit 13a is initialized to 0, and the frequency adjustment value $FR_{UD2}$ is also set to 0. As a result, the sampling clock generation circuit 13 stops adjusting the frequency of the sampling clock.

After the time period T1 elapses, if the clear signal CLR 2 is maintained at the H level for the predetermined time period (timing t13), the integration circuit 23 initializes the integral value to 0. Consequently, the reset determination circuit 25 lowers the logic level of the reset signal $FD_{rst}$ to the L level. Subsequently, when the frequency adjustment value $FR_{UD1}$ changes again (timing t14), the like processing is performed.

In addition, the thresholds Vth 3 and Vth 4 used by the reset determination circuit 25 are set based on the range (offset) within which the sampling clock generation circuit 13 is able to converge the frequency of the sampling clock into the target frequency by using its phase adjustment functions, for example. There is a specified value for the offset, which is approximately ±100 to 1000 ppm with respect to the target frequency. For example, when the gain obtained by the frequency adjustment function is large (see the waveform 6 in FIG. 1), the frequency of the sampling clock is not converged into the offset range. To avoid this problem, the frequency adjustment value $FR_{UD1}$ is reset. The thresholds Vth 3 and Vth 4 are set so that the frequency of the sampling clock does not exceed the above offset range when the frequency of the sampling clock is continuously increased or decreased.

In addition, it is desirable that the time period T1 be short so that the frequency is updated more frequently. However, it is preferable that the time period T1 be longer than a time period that the integral value takes to reach the threshold Vth3 or Vth4 if the frequency adjustment value $FR_{UD1}$ indicating "+1" or "−1" is continuously outputted. This is because the frequency adjustment value $FR_{UD1}$ may not be reset if the frequency adjustment value $FR_{UD1}$ indicating "+1" or "−1" is continuously outputted and if the logic level of the clear signal CLR 2 is raised to the H level again before the integral value reaches the threshold Vth 3 or Vth 4. It is desirable that the time period T1 be set in consideration of a margin and be approximately twice the time that the integral value takes to reach the threshold Vth3 or Vth4 when the frequency adjustment value $FR_{UD1}$ indicating "+1" or "−1" is continuously outputted.

Figure 7:
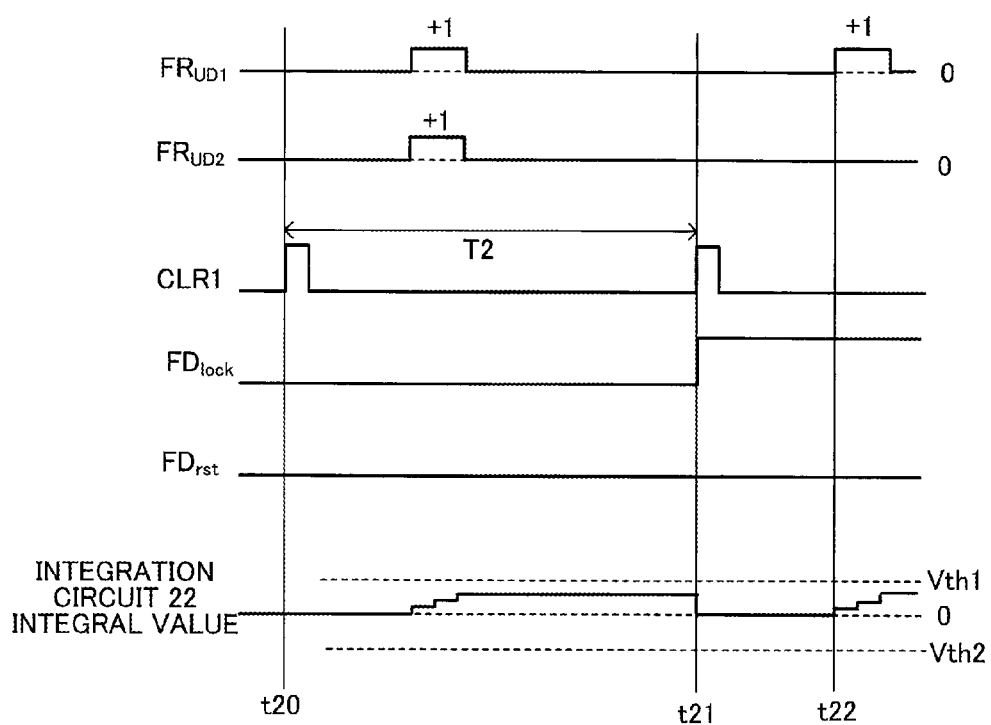
FIG. 7 illustrates an example of synchronization determination processing performed by the frequency pull-in control circuit.

FIG. 7 illustrates an example of synchronization determination processing performed by the frequency pull-in control circuit 14.

In FIG. 7, among the waveforms of the signals illustrated in FIG. 6, those of the clear signal CLR 2 and the integral value outputted from the integration circuit 23 are not illustrated.

As illustrated in FIG. 7, the logic level of the clear signal CLR 1 is raised to the H level for a predetermined time period after timing t20, and this logic level is raised to the H level again for the predetermined time period after timing t21. From the timing t20 to t21, the integral value outputted from the integration circuit is maintained within the range between the thresholds Vth 1 and Vth 2. Therefore, the lock determination circuit 24 raises the logic level of the lock signal $FD_{lock}$ to the H level at the timing t21. While the logic level of the lock signal $FD_{lock}$ is at the H level, even if the frequency adjustment value $FR_{UD1}$ is changed from 0 (timing t22), the selection circuit 26 maintains the frequency adjustment value $FR_{UD2}$ at 0. In this way, the sampling clock generation circuit 13 stops its frequency adjustment function. In the meantime, the phase adjustment function of the sampling clock generation circuit 13 continues to operate. Consequently, even if the frequency of the sampling clock differs from the target frequency, the difference is decreased by the phase adjustment function. As described above, since the gain of the CP 13b1 is smaller than that of the CP 13b2, the change of the frequency of the sampling clock made by the phase adjustment function is less than the change made by the frequency adjustment function.

With the above operation, the frequency of the sampling clock indicates the characteristics as illustrated by the waveform 7 in FIG. 1. Namely, the reception circuit 10 provides similar advantageous effects to those provided by the reception circuit 1 according to the first embodiment.

Third Embodiment

Figure 8:
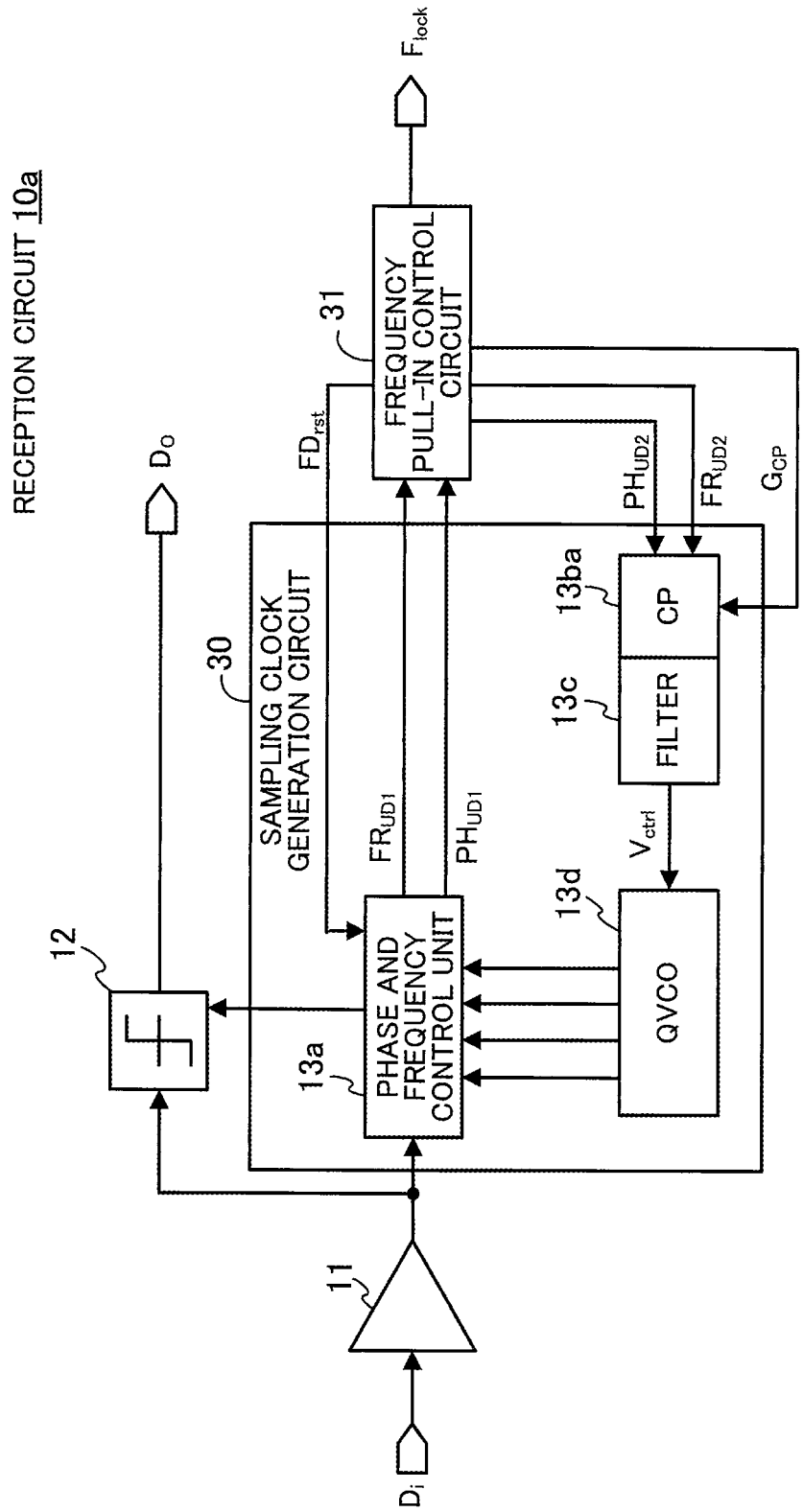
FIG. 8 illustrates an example of a reception circuit according to a third embodiment.

FIG. 8 illustrates an example of a reception circuit 10a according to a third embodiment.

The same elements as those in the reception circuit 10 according to the second embodiment illustrated in FIG. 2 are denoted by the same reference characters.

A frequency pull-in control circuit 31 in the reception circuit 10a according to the third embodiment outputs a gain change signal $G_{CP}$ for changing the gain of a CP 13ba in a sampling clock generation circuit 30.

In addition, in addition to the frequency adjustment value $FR_{UD1}$, the frequency pull-in control circuit 31 receives a phase adjustment value $PH_{UD1}$ outputted from the phase and frequency control unit 13a. Irrespective of the value of the phase adjustment value $PH_{UD1}$, until the logic level of the lock signal $F_{lock}$ is raised to the H level, the frequency pull-in control circuit 31 outputs 0 as a phase adjustment value $PH_{UD2}$. When the logic level of the lock signal $F_{lock}$ is raised to the H level, the frequency pull-in control circuit 31 outputs the phase adjustment value $PH_{UD1}$ as the phase adjustment value $PH_{UD2}$.

On the basis of the phase adjustment value $PH_{UD2}$ or the frequency adjustment value $FR_{UD2}$, the CP 13ba adjusts a current value that it outputs. In addition, on the basis of the gain change signal $G_{CP}$, the CP 13ba changes the amount of change of the current value made each time the phase adjustment value $PH_{UD2}$ or the frequency adjustment value $FR_{UD2}$ is set to "+1" or "−1." If the gain change signal $G_{CP}$ instructs the CP 13ba to decrease the gain, the CP 13ba decreases the above amount of change of the current value. If the gain change signal $G_{CP}$ instructs the CP 13ba to increase the gain, the CP 13ba increases the above amount of change of the current value.

Figure 9:
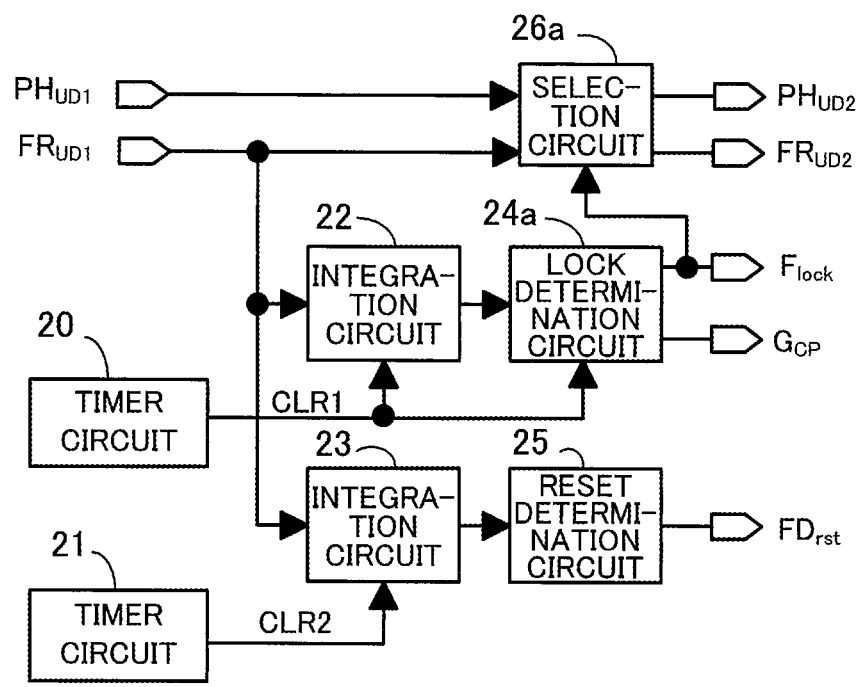
FIG. 9 illustrates an example of a frequency pull-in control circuit included in the reception circuit according to the third embodiment.

FIG. 9 illustrates an example of the frequency pull-in control circuit 31 in the reception circuit 10a according to the third embodiment.

The same elements as those in the frequency pull-in control circuit 14 illustrated in FIG. 3 are denoted by the same reference characters.

A lock determination circuit 24a in the frequency pull-in control circuit 31 illustrated in FIG. 9 determines whether the integral value outputted from the integration circuit 22 falls within the range defined by the two thresholds in the above individual time period T2 and outputs the gain change signal $G_{CP}$ that instructs change of the gain of the CP 13ba.

If the integral value outputted from the integration circuit 22 falls within the range defined by the two thresholds in a time period 12 (if the logic level of the lock signal $F_{lock}$ is raised to the H level), the lock determination circuit 24a outputs the gain change signal $G_{CP}$ for decreasing the gain of the CP 13ba. If the integral value outputted from the integration circuit 22 is out of the range defined by the two thresholds in a time period T2 (if the logic level of the lock signal $F_{lock}$ is the L level), the lock determination circuit 24a outputs the gain change signal $G_{CP}$ for increasing the gain of the CP 13ba.

A selection circuit 26a receives the phase adjustment value $PH_{UD1}$ outputted from the phase and frequency control unit 13a, in addition to the frequency adjustment value $FR_{UD1}$. Irrespective of the value of the phase adjustment value $PH_{UD1}$, the selection circuit 26a outputs 0 as the phase adjustment value $PH_{UD2}$ until the logic level of the lock signal $F_{lock}$ is raised to the H level. When the logic level of the lock signal $F_{lock}$ is raised to the H level, the selection circuit 26a outputs the phase adjustment value $PH_{UD1}$ as the phase adjustment value $PH_{UD2}$.

The above reception circuit 10a provides similar advantageous effects to those provided by the reception circuit 10 according to the second embodiment.

In addition, with the reception circuit 10a, when the frequency of the sampling clock is adjusted (while the logic level of the lock signal $F_{lock}$ is at the L level), the phase adjustment value $PH_{UD1}$ outputted from the phase and frequency control unit 13a is not transmitted to the CP 13ba. Therefore, the frequency adjustment operation is not disturbed. As a result, the frequency of the sampling clock is converged to the target frequency more quickly. In addition, while the logic level of the lock signal $F_{lock}$ is at the L level, the lock determination circuit 24a outputs the gain change signal $G_{CP}$ for increasing the gain of the CP 13ba. Consequently, the amount of change of the current value made each time when the frequency adjustment value $FR_{UD2}$ is set to "+1" or "−1" is increased. As a result, the amount of change of the frequency is increased. Thus, the frequency of the sampling clock is converged to the target frequency more quickly.

In addition, when the adjustment of the frequency of the sampling clock is completed (when the logic level of the lock signal $F_{lock}$ is raised to the H level), the lock determination circuit 24a outputs the gain change signal $G_{CP}$ for decreasing the gain of the CP 13ba. As a result, the noise that appears in the determined value $D_o$ is reduced.

Fourth Embodiment

Figure 10:
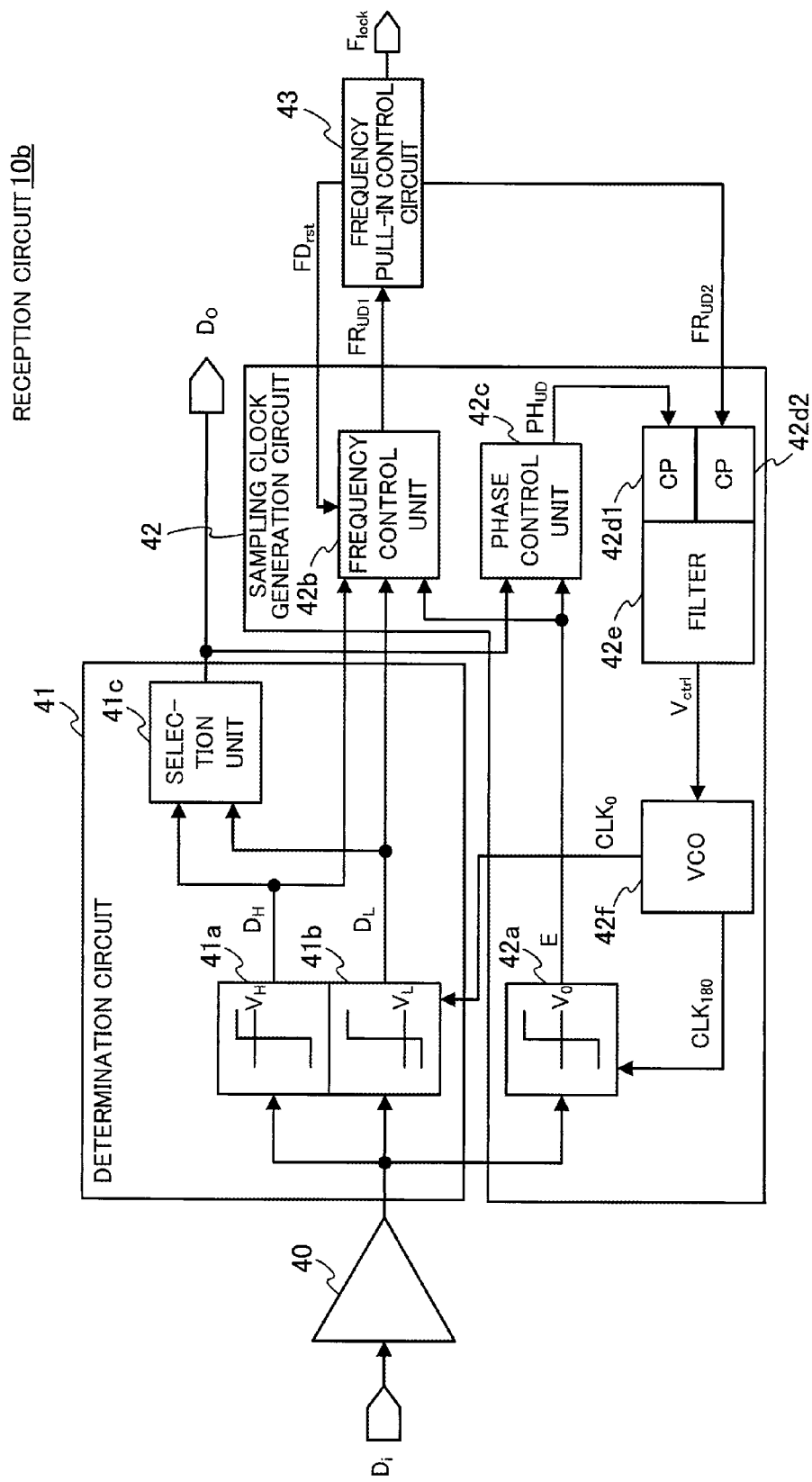
FIG. 10 illustrates an example of a reception circuit according to a fourth embodiment.

FIG. 10 illustrates an example of a reception circuit 10b according to a fourth embodiment.

The reception circuit 10b according to the fourth embodiment uses the 2× sampling method to detect the frequency of the sampling clock. In this method, sampling is performed twice per UI. In addition, the reception circuit 10b includes a function of a speculative decision feedback equalizer (DFE). The reception circuit 10b includes a buffer 40, a determination circuit 41, a sampling clock generation circuit 42, and a frequency pull-in control circuit 43.

The buffer 40 performs equalization processing on an input data signal $D_i$.

The determination circuit 41 and the sampling clock generation circuit 42 include functions equivalent to those of the determination circuit 2 and the sampling clock generation circuit 3 illustrated in FIG. 1, respectively. The frequency pull-in control circuit 43 includes functions equivalent to those of the frequency pull-in control circuit 4 illustrated in FIG. 1 or the frequency pull-in control circuit 14 illustrated in FIG. 2.

The determination circuit 41 and the sampling clock generation circuit 42 in the reception circuit 10b according to the fourth embodiment differ from the comparison circuits 12 and the sampling clock generation circuits 13 and 30 in the reception circuits 10 and 10a illustrated in FIGS. 2 and 8.

The determination circuit 41 includes comparison circuits 41a and 41b and a selection unit 41c. In addition, the sampling clock generation circuit 42 includes a comparison circuit 42a, a frequency control unit 42b, a phase control unit 42c, CPs 42d1 and 42d2, a filter 42e, and a voltage controlled oscillator (VCO) 42f.

The comparison circuit 41a compares a data signal outputted from the buffer 40 with a threshold $V_H$ at a rising edge of the clock $CLK_0$ and outputs a comparison result $D_H$. The threshold $V_H$ is larger than a threshold $V_0$ that corresponds to the median of the amplitude of the data signal.

The comparison circuit 41b compares the data signal with a threshold $V_L$ at the same comparison timing as that of the comparison circuit 41a and outputs a comparison result $D_L$. The threshold $V_L$ is smaller than the threshold $V_0$.

On the basis of a determined value $D_o$ (a previous determined value) inputted as a selection signal, the selection unit 41c selects either the comparison result $D_H$ outputted from the comparison circuit 41a or the comparison result $D_L$ outputted from the comparison circuit 41b and holds a value of the selected comparison result. In addition, the selection unit 41c outputs the held value as a new determined value $D_o$.

The comparison circuit 42a compares the data signal with the threshold $V_0$ at a rising edge of the clock $CLK_{180}$ and outputs a comparison result E.

On the basis of the comparison results $D_H$, $D_L$, and E, the frequency control unit 42b detects the frequency difference between the data signal and the frequency of the clocks $CLK_0$ and $CLK_{180}$. On the basis of the detected frequency difference, the frequency control unit 42b outputs a frequency adjustment value $FR_{UD1}$ to adjust the frequency of the clocks $CLK_0$ and $CLK_{180}$.

On the basis of the determined value $D_o$ and the comparison result E, the phase control unit 42c detects the phase difference between the data signal and the phases of the clocks $CLK_0$ and $CLK_{180}$. On the basis of the detected phase difference, the phase control unit 42c outputs a phase adjustment value $PH_{UD}$ to adjust the phases of the clocks $CLK_0$ and $CLK_{180}$.

On the basis of the phase adjustment value $PH_{UD}$ outputted from the phase control unit 42c, the CP 42d1 adjusts a current value. On the basis of the frequency adjustment value $FR_{UD2}$ outputted from the frequency pull-in control circuit 43, the CP 42d2 adjusts the current value. The outputs from the CPs 42d1 and 42d2 are short-circuited. The gain of the CP 42d2 is larger than that of the CP 42d1.

The filter 42e converts the current value outputted from the CPs 42d1 and 42d2 into a voltage value and outputs the converted voltage value as a control voltage value $V_{ctrl}$.

Based on the control voltage value $V_{ctrl}$, the VCO 42f outputs clocks of two phases $CLK_0$ and $CLK_{180}$ whose oscillation frequencies have been changed. For example, a rising edge (or a falling edge) of the clock $CLK_{180}$ is shifted from a rising edge (or a falling edge) of the clock $CLK_0$ by half of 1 UI.

The frequency control unit 42b in the above reception circuit 10b outputs the frequency adjustment value $FR_{UD1}$ as described below, for example.

Figure 11:
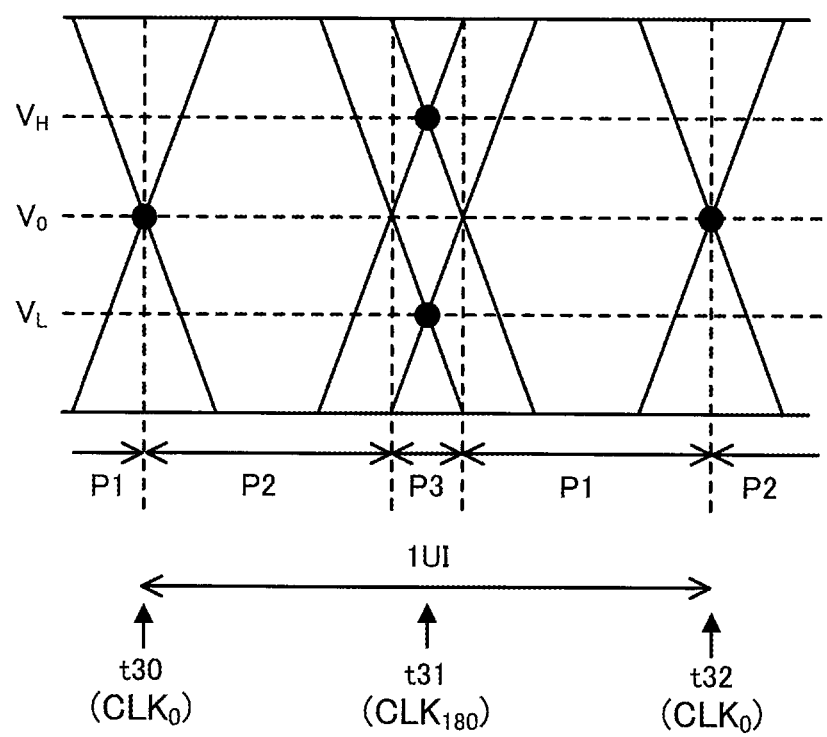
FIG. 11 illustrates an example of sampling timing at which a data signal is sampled by using clocks of two phases.

FIG. 11 illustrates an example of sampling timing at which a data signal is sampled by using clocks of two phases. FIG. 11 illustrates an example of a data signal and rising edges of the clocks $CLK_0$ and $CLK_{180}$ outputted from the VCO 42f. For example, timing t30 and t32 represent rising edges of the clock $CLK_0$, and timing t31 represents a rising edge of the clock $CLK_{180}$. In FIG. 11, data signals of various data patterns are superimposed.

When the frequency is detected by using the 2× sampling method, sampling is performed twice per UI. For example, a phase region from 0° to 360° is divided by the above timing t30 to t32 into three regions P1 to P3.

Figure 12:
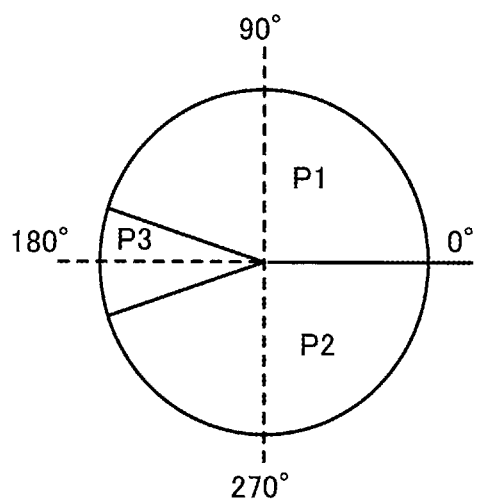
FIG. 12 illustrates an example of a phase region from 0° to 360° divided into three regions.

FIG. 12 illustrates an example of a phase region from 0 to 360° divided into three regions.

The region P1 starts at the timing t30 or t32 illustrated in FIG. 11 and ends at the start point of the region P3. The region P2 starts at the end point of the region P3 and ends at the timing t30 or t32 (the start point of the region P1) illustrated in FIG. 11. In the example in FIG. 12, the phase of the start point of the region P1 and the end point of the region P2 correspond to 0°.

The region P3 is a region set between the regions P1 and P2 so that the timing t31 illustrated in FIG. 11 is in the center of the region P3. The width of the region P3 varies depending on the slew rate of the data signal and the above thresholds $V_H$ and $V_L$. For example, if the slew rate of the data signal is small, the region P3 is wide, and if the slew rate is large, the region P3 is narrow. In addition, for example, if the threshold $V_H$ is large or the threshold $V_L$ is small, the region P3 is wide. In contrast, if the threshold $V_H$ is small or the threshold $V_L$ is large, the region P3 is narrow. In addition, the widths of the regions P1 and P2 vary depending on the width of the region P3.

The detectable frequency range of the clocks $CLK_0$ and $CLK_{180}$ and the detection rate vary depending on the width of the region P3. This is because, if the region P3 is excessively narrow, even if the frequency of the clock $CLK_0$ or $CLK_{180}$ is changed, the change over the regions P1 to P3 (phase rotation) may not be detected. Therefore, on the basis of the characteristics such as the slew rate of the data signal, the thresholds $V_H$ and $V_L$ of the comparison circuits 41a and 41b, respectively, may be set, to set the range of the region P3. In this way, a desired frequency detection rate is obtained.

On the basis of the comparison results $D_H$, $D_L$, and E, the frequency control unit 42b detects where an edge of the data signal exists in the above regions P1 to P3. On the basis of change of the region in which the edge exists, the frequency control unit 42b detects the rotation direction of the phase of the edge of the data signal. In this way, the frequency control unit 42b detects whether each of the frequency of the clocks $CLK_0$ and $CLK_{180}$ is higher or lower than the frequency of the data signal. Next, on the basis of the detection result, the frequency control unit 42b outputs a frequency adjustment value $FR_{UD1}$ to adjust the frequency of the clocks $CLK_0$ and $CLK_{180}$.

The frequency pull-in control circuit 43 in the reception circuit 10b according to the present embodiment also performs integration on frequency adjustment values $FR_{UD1}$ and obtains an integral value in the individual time period T1 (see FIG. 6). If the integral value reaches a certain value (threshold) before a time period T1 elapses, the frequency pull-in control circuit 43 outputs a reset signal $FD_{rst}$ that causes the frequency control unit 42b to output an initial value of the frequency adjustment value $FR_{UD1}$ until the time period T1 elapses. In addition, the frequency pull-in control circuit 43 continuously performs integration on frequency adjustment values $FR_{UD1}$ and obtains an integral value in the individual time period T2 (see FIG. 7) and determines whether the frequency of the sampling clock is converged. Until the frequency pull-in control circuit 43 determines that the frequency of the sampling clock is synchronized with the target frequency, the frequency pull-in control circuit 43 outputs the frequency adjustment value $FR_{UD1}$ as the frequency adjustment value $FR_{UD2}$ to the CP 42d2. When the frequency pull-in control circuit 43 determines that the frequency of the sampling clock has been synchronized with the target frequency, the frequency pull-in control circuit 43 sets the frequency adjustment value $FR_{UD2}$ to 0. In addition, when the frequency pull-in control circuit 43 determines that the frequencies have been synchronized, for example, the frequency pull-in control circuit 43 outputs an H-level lock signal $F_{lock}$.

The frequency pull-in control circuit 43 may be realized by using the same circuit as that of the frequency pull-in control circuit 14 illustrated in FIG. 3.

In this way, the reception circuit 10b according to the fourth embodiment provides similar advantageous effects to those provided by the reception circuit 10 according to the second embodiment. In addition, the reception circuit 10b according to the fourth embodiment performs two sampling operations and three comparison determination operations by using clocks of two phases $CLK_0$ and $CLK_{180}$ and detects whether the frequency of the clocks $CLK_0$ and $CLK_{180}$ is higher or lower than that of the data signal. In this way, the sampling is performed less frequently. In addition, since the number of clocks is made less, the number of circuits otherwise needed is reduced. Namely, the reception circuit 10b needs a smaller circuit area. In addition, since the number of circuits is reduced, the power consumption is reduced.

In addition, the reception circuit 10b realizes a function of a speculative DFE by using the comparison results $D_H$ and $D_L$ outputted from the comparison circuits 41a and 41b, respectively. Thus, an increase of the circuit area due to the addition of the function of the speculative DFE is prevented.

Fifth Embodiment

Figure 13:
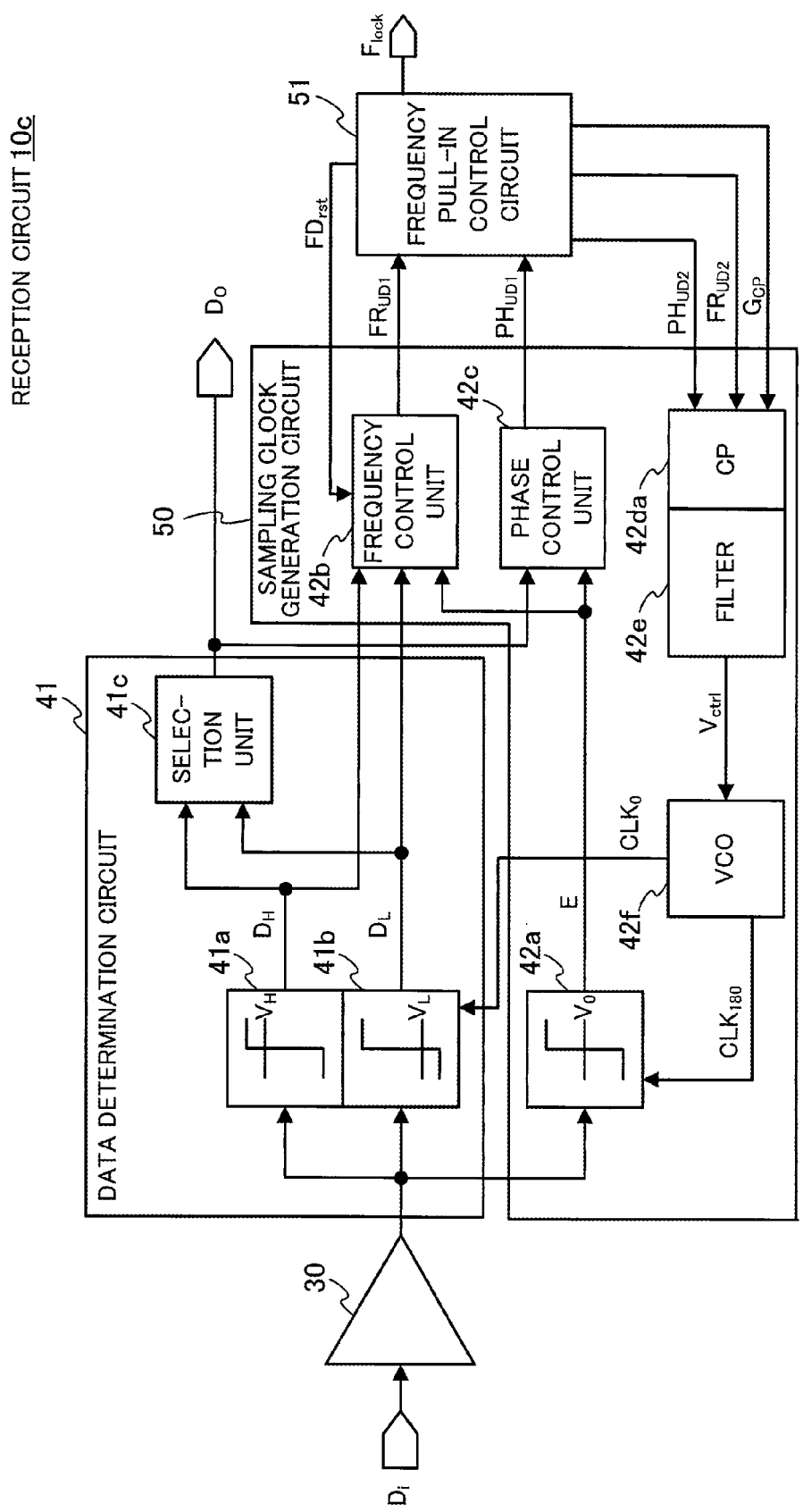
FIG. 13 illustrates an example of a reception circuit according to a fifth embodiment.

FIG. 13 illustrates an example of a reception circuit 10c according to a fifth embodiment.

The same elements as those in the reception circuit 10b according to the fourth embodiment illustrated in FIG. 10 are denoted by the same reference characters.

A frequency pull-in control circuit 51 in the reception circuit 10c according to the fifth embodiment includes functions equivalent to those of the frequency pull-in control circuit 31 in the reception circuit 10a according to the third embodiment.

Namely, the frequency pull-in control circuit 51 outputs a gain change signal $G_{CP}$ that instructs a CP 42da in a sampling clock generation circuit 50 to change the gain of the CP 42da. In addition, in addition to the frequency adjustment value $FR_{UD1}$ outputted from the frequency control unit 42b, the frequency pull-in control circuit 51 receives a phase adjustment value $PH_{UD1}$ outputted from the phase control unit 42c. Irrespective of the value of the phase adjustment value $PH_{UD1}$, until the logic level of the lock signal $F_{lock}$ is raised to the H level, the frequency pull-in control circuit 51 outputs 0 as the phase adjustment value $PH_{UD2}$ to. When the logic level of the lock signal $F_{lock}$ is raised to the H level, the frequency pull-in control circuit 51 outputs the phase adjustment value $PH_{UD1}$ as the phase adjustment value $PH_{UD2}$.

On the basis of the phase adjustment value $PH_{UD2}$ or the frequency adjustment value $FR_{UD2}$, the CP 42da adjusts a current value that it outputs. In addition, on the basis of the gain change signal $G_{CP}$, the CP 42da changes the amount of change of the current value made each time the phase adjustment value $PH_{UD2}$ or the frequency adjustment value $FR_{UD2}$ is set to "+1" or "−1." If the gain change signal $G_{CP}$ instructs the CP 42da to decrease the gain, the CP 42da decreases the amount of change of the current value. If the gain change signal $G_{CP}$ instructs the CP 42da to increase the gain, the CP 42da increases the amount of change of the current value.

The frequency pull-in control circuit 51 is realized by using the same circuit as that of the frequency pull-in control circuit 31 illustrated in FIG. 9.

The reception circuit 10c according to the fifth embodiment provides similar advantageous effects to those provided by the reception circuits 10a and 10b according to the third and fourth embodiments, respectively.

Sixth Embodiment

Figure 14:
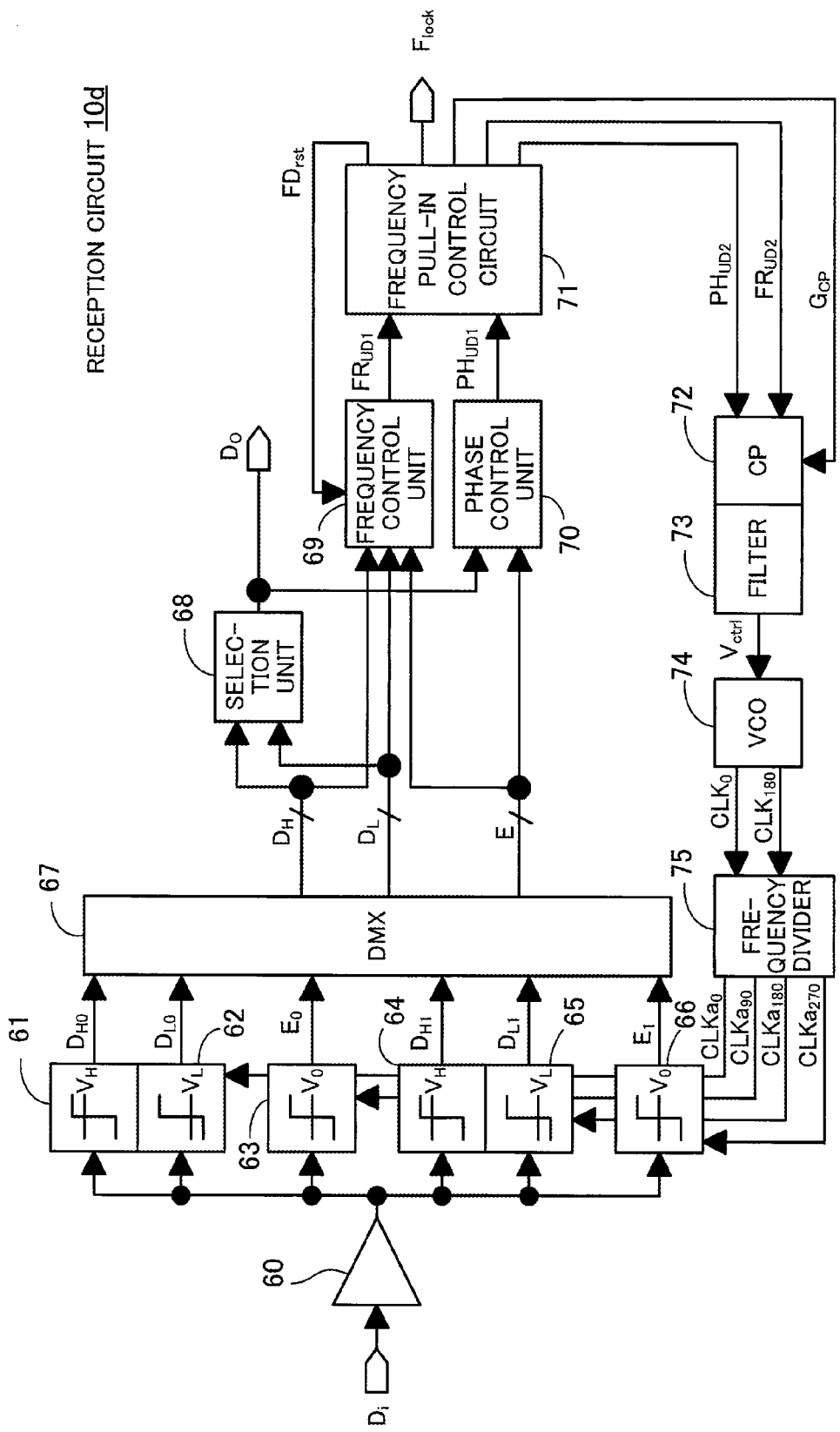
FIG. 14 illustrates an example of a reception circuit according to a sixth embodiment.

FIG. 14 illustrates an example of a reception circuit 10d according to a sixth embodiment.

The reception circuit 10d includes a buffer 60 and comparison circuits 61 to 66. In addition, the reception circuit 10d includes a demultiplexer (hereinafter, referred to as a DMX) 67, a selection unit 68, a frequency control unit 69, a phase control unit 70, a frequency pull-in control circuit 71, a CP 72, a filter 73, a VCO 74, and a frequency divider 75.

To enable an interleaving operation, the reception circuit 10d forms a parallel structure of the comparison circuits 61 to 63 and the comparison circuits 64 to 66. In this way, even when the input data signal $D_i$ has a high frequency, by performing parallel processing, the reception circuit 10d is able to perform a CDR operation.

The buffer 60 performs equalization processing on the input data signal $D_i$ and outputs the processed data signal.

The comparison circuits 61 and 62 compare the data signal outputted from the buffer 60 with thresholds $V_H$ and $V_L$ at a rising edge of a clock $CLKa_0$ and output comparison results $D_{H0}$ and $D_{L0}$, respectively.

The comparison circuit 63 compares the data signal outputted from the buffer 60 with a threshold $V_0$ at a rising edge of a clock $CLKa_{90}$ and outputs a comparison result $E_0$.

The comparison circuits 64 and 65 compare the data signal outputted from the buffer 60 with the thresholds $V_H$ and $V_L$ at a rising edge of a clock $CLKa_{180}$ and output comparison results $D_{H1}$ and $D_{L1}$, respectively.

The comparison circuit 66 compares the data signal outputted from the buffer 60 with the threshold $V_0$ at a rising edge of a clock $CLKa_{270}$ and output a comparison result $E_1$.

The DMX 67 demultiplexes the 2 bits of the comparison results $D_{H0}$ and $D_{H1}$, each of which is 1 bit, and outputs an n-bit comparison result $D_H$. The DMX 67 demultiplexes the 2 bits of the comparison results $D_{L0}$ and $D_{L1}$, each of which is 1 bit, and outputs an n-bit comparison result $D_L$. In addition, the DMX 67 demultiplexes the 2 bits of the comparison results $E_0$ and $E_1$, each of which is 1 bit, and outputs an n-bit comparison result E.

The selection unit 68, the frequency control unit 69, the phase control unit 70, and the frequency pull-in control circuit 71 include functions equivalent to those of the selection unit 41c, the frequency control unit 42b, the phase control unit 42c, and the frequency pull-in control circuit 51 in the reception circuit 10c according to the fifth embodiment, respectively. In addition, the CP 72, the filter 73, and the VCO 74 include functions equivalent to those of the CP 42da, the filter 42e, and the VCO 42f in the reception circuit 10c according to the fifth embodiment, respectively.

The frequency divider 75 divides the clocks $CLK_0$ and $CLK_{180}$ outputted from the VCO 74 to generate clocks of four phases $CLKa_0$ to $CLKa_{270}$.

The frequency of the clocks $CLKa_0$ to $CLKa_{270}$ is half the frequency of the clocks $CLK_0$ and $CLK_{180}$ in the reception circuit 10c according to the fifth embodiment. For example, assuming that the phase of the clock $CLKa_0$ is 0°, the phase of the clock $CLKa_{90}$ differs from the phase of the clock $CLKa_0$ by 90θ. In addition, the phase of the clock $CLKa_{180}$ differs from the phase of the clock $CLKa_0$ by 180°. In addition, the phase of the clock $CLKa_{270}$ differs from the phase of the clock $CLKa_0$ by 270°.

In the reception circuit 10d according to the present embodiment, in synchronization with the rising edges of the clocks of four phases $CLKa_0$ to $CLKa_{270}$, the comparison circuits 61 to 66 sequentially start to operate. Thus, the reception circuit 10d operates with half of the frequency of the reception circuit 10c. In addition, since each of the outputs from the comparison circuits 61 to 66 is demultiplexed by the DMX 67 into 2:n and converted into low-speed parallel data, the circuits downstream of the DMX 67 operate at such a speed that is 1/n of the speed of the reception circuit 10c. As a result, constraints on the circuit operation speed are accommodated. Namely, relatively slow circuits may be used.

In addition, while the above reception circuit 10d performs an interleaving operation with a 2-parallel structure, a 3 or more-parallel structure may alternatively be used. By decreasing the frequency of the clock on the basis of the parallel structure number and increasing the number of clocks having different phases, frequency detection processing performed by a lower-speed circuit is realized.

In addition, the number of comparison circuits in the reception circuits 10, 10a, and 10b according to the second to fourth embodiments, respectively, may also be increased, and the DMX and the frequency divider may be added to each of the reception circuits, so that the reception circuits can perform the above interleaving operation.

According to the reception circuits disclosed herein, the time needed for converging the frequency of the sampling clock is shortened.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A reception circuit comprising:
a determination circuit configured to receive an input data signal and determine a value of the input data signal when a logic level of a sampling clock changes;
a sampling clock generation circuit configured to generate the sampling clock based on the input data signal, generate a frequency adjustment value based on a frequency difference between the sampling clock and the input data signal, and adjust a frequency of the sampling clock based on the frequency adjustment value; and
a frequency pull-in control circuit configured to perform integration on the frequency adjustment value obtained in plurality and obtain a first integral value in an individual first time period,
wherein, when the first integral value reaches a first value before a single first time period elapses, the frequency pull-in control circuit outputs a reset signal that causes the sampling clock generation circuit to output an initial value of the frequency adjustment value until the first time period elapses.

2. The reception circuit according to claim 1,
wherein the frequency pull-in control circuit performs integration on the frequency adjustment value obtained in plurality and obtains a second integral value in an individual second time period, and
wherein, when the second integral value in a single second time period falls within a first range, the frequency pull-in control circuit outputs a lock signal that indicates that the frequency of the sampling clock is synchronized with the frequency of the input data signal and causes the sampling clock generation circuit to stop adjusting the frequency, based on the frequency adjustment value.

3. The reception circuit according to claim 2,
wherein the frequency pull-in control circuit includes:
a first integration circuit configured to generate the first integral value;
a second integration circuit configured to generate the second integral value;
a first timer circuit configured to output a first clear signal for setting the first integral value to 0 in the individual first time period;
a second timer circuit configured to output a second clear signal for setting the second integral value to 0 in the individual second time period;
a reset determination circuit configured to compare the first integral value with the first value and output the reset signal when the first integral value reaches the first value;
a lock determination circuit configured to determine whether the second integral value in a single second time period falls within the first range and output the lock signal based on the second clear signal when the second integral value falls within the first range; and
a selection circuit configured to select whether to cause the sampling clock generation circuit to stop adjusting the frequency based on the frequency adjustment value, based on the lock signal outputted from the lock determination circuit.

4. The reception circuit according to claim 2,
wherein the sampling clock generation circuit generates a phase adjustment value based on a phase difference between the sampling clock and the input data signal and adjusts a phase of the sampling clock based on the phase adjustment value, and
wherein, when the second integral value in a single second time period is out of the first range, the frequency pull-in control circuit causes the sampling clock generation circuit to stop adjusting the phase based on the phase adjustment value.

5. The reception circuit according to claim 4,
wherein the frequency pull-in control circuit includes:
a first integration circuit configured to generate the first integral value;
a second integration circuit configured to generate the second integral value;
a first timer circuit configured to output a first clear signal for setting the first integral value to 0 in the individual first time period;
a second timer circuit configured to output a second clear signal for setting the second integral value to 0 in the individual second time period;
a reset determination circuit configured to compare the first integral value with the first value and output the reset signal when the first integral value reaches the first value;

a lock determination circuit configured to determine whether the second integral value in a single second time period falls within the first range and output the lock signal based on the second clear signal when the second integral value falls within the first range; and a selection circuit configured to select whether to cause the sampling clock generation circuit to stop adjusting the phase based on the phase adjustment value or adjusting the frequency based on the frequency adjustment value, based on the lock signal outputted from the lock determination circuit.

6. The reception circuit according to claim 4,
wherein the sampling clock generation circuit includes a charge pump that adjusts the frequency or the phase by changing a current value that the charge pump outputs based on the frequency adjustment value or the phase adjustment value, and wherein, when the second integral value in a single second time period falls within the first range, the frequency pull-in control circuit outputs a gain change signal for changing a gain of the charge pump from a first gain to a second gain that is smaller than the first gain.

7. The reception circuit according to claim 6,
wherein, when the second integral value in a single second time period falls within the first range, the lock determination circuit outputs a gain change signal for changing a gain of the charge pump from a first gain to a second gain that is smaller than the first gain.

8. The reception circuit according to claim 1,
wherein the individual first time period is longer than a time period needed for the first integral value to reach the first value when a same frequency adjustment value is continuously generated.

* * * * *